United States Patent
McKinsey

(10) Patent No.: US 8,767,179 B2
(45) Date of Patent: Jul. 1, 2014

(54) IMAGING METHODS IN SCANNING PHOTOLITHOGRAPHY AND A SCANNING PHOTOLITHOGRAPHY DEVICE USED IN PRINTING AN IMAGE OF A RETICLE ONTO A PHOTOSENSITIVE SUBSTRATE

(75) Inventor: Wes McKinsey, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 743 days.

(21) Appl. No.: 12/638,094

(22) Filed: Dec. 15, 2009

(65) Prior Publication Data

US 2011/0141443 A1    Jun. 16, 2011

(51) Int. Cl.
G03B 27/54 (2006.01)
G03B 27/72 (2006.01)
G03F 7/20 (2006.01)

(52) U.S. Cl.
CPC ........ G03F 7/70208 (2013.01); G03F 7/70275 (2013.01); *G03F 7/70191* (2013.01)
USPC .................................. 355/67; 355/71; 355/77

(58) Field of Classification Search
CPC .......................... G03F 7/70275; G03F 7/70208; G03F 7/70425
USPC .................... 355/53, 67, 70, 71, 77
See application file for complete search history.

(56) References Cited

U.S. PATENT DOCUMENTS

| | | | |
|---|---|---|---|
| 4,851,882 A * | 7/1989 | Takahashi et al. | 355/46 |
| 5,359,389 A * | 10/1994 | Isohata | 355/53 |
| 5,581,075 A * | 12/1996 | Naraki et al. | 250/205 |
| 6,013,401 A | 1/2000 | McCullough et al. | |
| 6,292,255 B1 | 9/2001 | McCullough | |
| 6,486,492 B1 | 11/2002 | Su | |
| 6,509,952 B1 | 1/2003 | Govil et al. | |
| 6,573,975 B2 | 6/2003 | Govil et al. | |
| 6,922,230 B2 | 7/2005 | Govil et al. | |
| 7,144,690 B2 | 12/2006 | Van Itallie et al. | |
| 7,253,882 B2 * | 8/2007 | Ozaki et al. | 355/67 |
| 7,286,208 B2 * | 10/2007 | Smith et al. | 355/55 |
| 7,556,897 B2 | 7/2009 | Yang | |
| 7,782,442 B2 * | 8/2010 | Nagasaka | 355/67 |
| 7,830,496 B2 * | 11/2010 | Kim et al. | 355/71 |
| 7,884,921 B2 * | 2/2011 | Noboru et al. | 355/67 |
| 2006/0183025 A1 | 8/2006 | Yang et al. | |
| 2007/0153247 A1 * | 7/2007 | Nagasaka | 355/53 |
| 2008/0284998 A1 | 11/2008 | Geh et al. | |
| 2009/0239162 A1 | 9/2009 | Yang | |
| 2010/0053583 A1 * | 3/2010 | Smith et al. | 355/67 |
| 2010/0079743 A1 * | 4/2010 | Hidaka et al. | 355/74 |

* cited by examiner

*Primary Examiner* — Steven H Whitesell Gordon
(74) *Attorney, Agent, or Firm* — Wells St. John, P.S.

(57) ABSTRACT

An imaging method in scanning photolithography includes application of different quantity first and second exposure doses of electromagnetic radiation through a reticle to a photosensitive substrate while scanning across a substrate exposure field along a direction of scan. The first dose spans entirely across the width of the exposure field during the scan and occurs all along the exposure field. The second dose covers less than the entire width of the exposure field during the scan, and is applied at a location spaced along the direction of scan from where the first dose is being applied while the first dose is being applied. Other embodiments are disclosed, including apparatus embodiments.

18 Claims, 8 Drawing Sheets

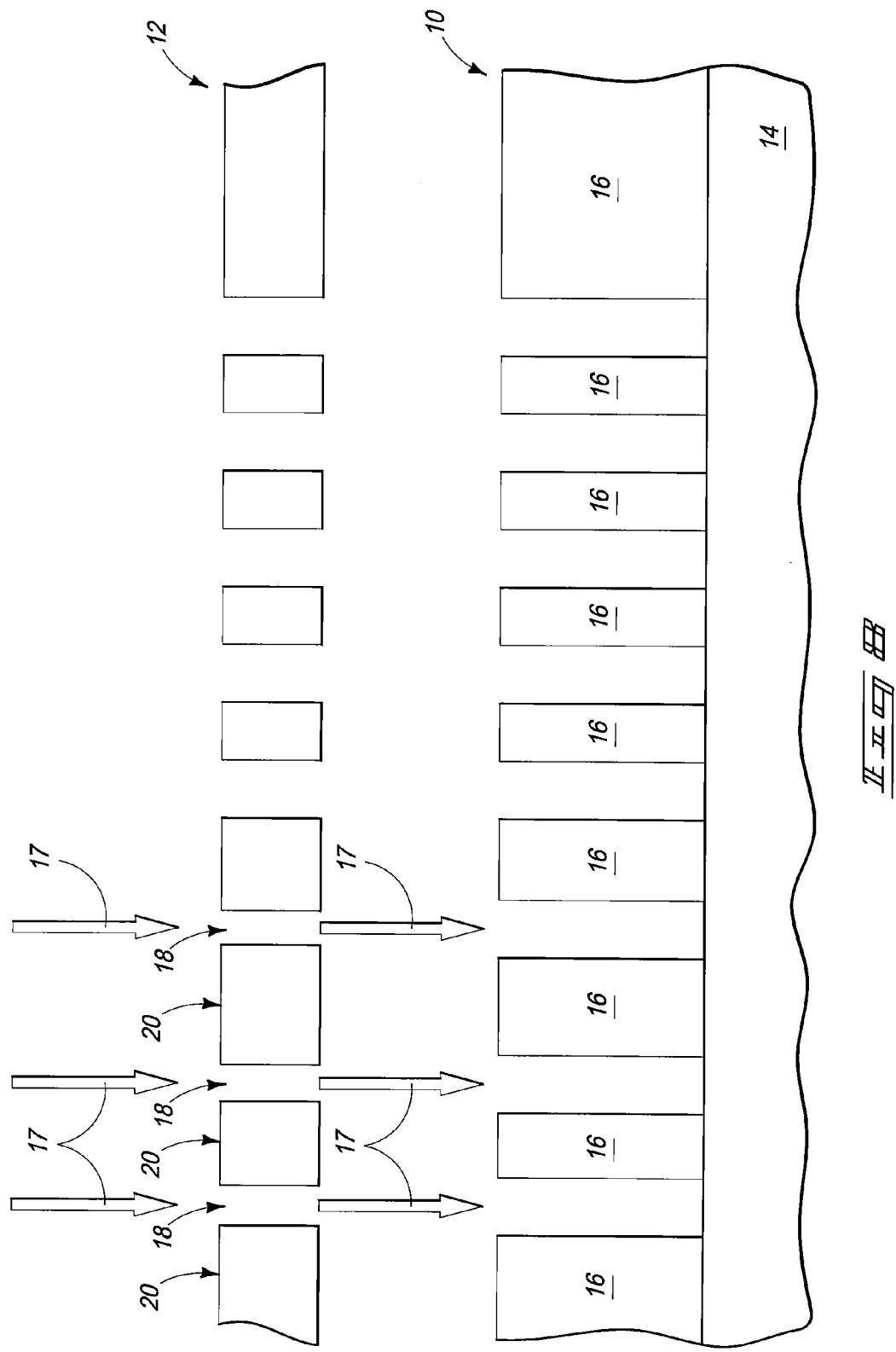

IMAGING METHODS IN SCANNING PHOTOLITHOGRAPHY AND A SCANNING PHOTOLITHOGRAPHY DEVICE USED IN PRINTING AN IMAGE OF A RETICLE ONTO A PHOTOSENSITIVE SUBSTRATE

TECHNICAL FIELD

Embodiments disclosed herein pertain to scanning photolithography methods and equipment.

BACKGROUND

Photolithography is used in the manufacturing of integrated circuitry to form device feature patterns onto a substrate. Generally, this involves projecting an image of a reticle onto photosensitive material received over a substrate. One type of photolithography is scanning photolithography. In such, electromagnetic radiation is passed through an exposure slit which is scanned at a predetermined rate across a reticle and which is imaged onto the photosensitive substrate. The reticle and photosensitive substrate move synchronously with each other at different rates in opposite directions such that an exposure field on the substrate is scanned.

Critical dimension (CD) is the dimension of the smallest geometrical features (i.e., width of interconnect line, contacts, trenches, etc.) which can be formed during semiconductor device/circuit manufacturing using given technology. Using photolithography, it is desirable that CD be consistent throughout the exposure field, and correspondingly across the entirety of the substrate being patterned. However, CD variation within an exposure field can occur in all types of photolithographic processing, including in scanning photolithography.

For example, FIG. 1 graphically depicts CD variation of a partial area of a scanned exposure field of a substrate relative to x and y axes defining that partial area. CD variation is evident in FIG. 1 from the differently shaded regions. If CD were constant throughout the depicted area, only a single uniform shading would be shown.

CD variation may be caused by a number of factors taken alone or in combination. For example, the reticle may not be fabricated as precisely as desired, wherein feature sizes in the reticle undesirably vary. FIG. 2 diagrammatically depicts one such example in the patterning of a substrate 10 using a reticle 12. Substrate 10 is shown as comprising a base substrate 14 having a photosensitive material 16, such as photoresist, formed thereover. Reticle 12 comprises an alternating array of blocks 20 and line openings 18 there-across. In this example, it was desired that reticle 12 be fabricated such that each line opening 18 and each block width be equal to the CD. However as shown, some of the blocks at the left in the figure are larger than the other blocks, thereby decreasing the width of the line spaces between such blocks with immediately adjacent blocks. Electromagnetic radiation 17 is used to ultimately transfer the pattern of reticle 12 to photosensitive material 16, thereby transferring the CD variation in reticle 12 onto substrate 10.

CD variation can also occur where a reticle is perfectly fabricated, or at least fabricated to within acceptable CD tolerances. For example, optical artifacts may be introduced by the scanning lithography equipment itself which results in CD variation at two or more different locations within an exposure field. Further, CD variation in a reticle may combine with CD variation due to any optical artifact and compound the variation.

Accordingly, need remains for improved methods in scanning photolithography equipment which enables reduction of CD variation within an exposure field. While the invention was primarily motivated in addressing these issues, it is no way so limited, with the invention only being limited by the accompanying claims appropriately interpreted in accordance with the doctrine of equivalence.

BRIEF DESCRIPTION OF THE DRAWINGS

FIG. 8 is a diagrammatic sectional view of possible photolithographic processing in accordance with an embodiment of the invention.

DETAILED DESCRIPTION OF EXAMPLE EMBODIMENTS

Embodiments of the invention include scanning photolithographic devices used in printing an image of a reticle onto a photosensitive substrate, and include imaging methods in scanning photolithography. The device embodiments are not limited by the method embodiments, nor are the method embodiments limited by the device embodiments. Accordingly, method embodiments might be practiced using other equipment. Further, the example device embodiments may be used or designed to practice method embodiments of the invention.

Figure 3:
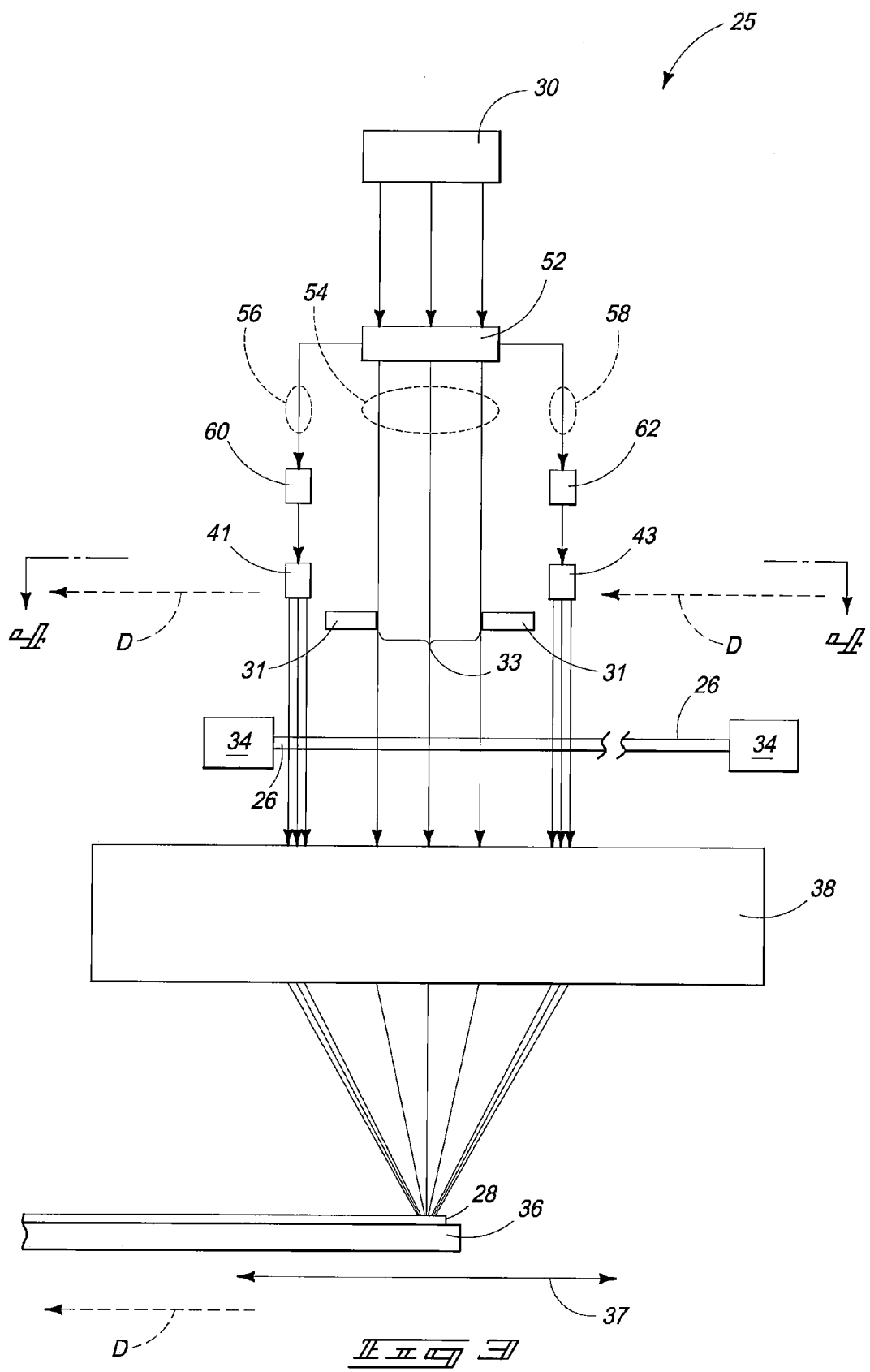
FIG. 3 is a schematic representation of a scanning photolithographic device is accordance with an embodiment of the invention.

Referring initially to FIG. 3, a scanning photolithographic device used in printing an image of a reticle onto a photosensitive substrate is indicated generally with reference numeral 25. For example, a reticle 26 having a desired pattern thereon is used to image the pattern onto a photosensitive substrate 28 using an illumination source 30. A single illumination source 30 is shown, although multiple sources might be used. A suitable device 31 defines an exposure slit 33 which is positioned to receive electromagnetic radiation (shown by down arrows) emanating from illumination source 30. Any existing or yet-to-be developed exposure slit might be defined, with example slit 33 shown to be a fixed rectangular size and shape. A reticle stage 34 is adapted to hold reticle 26. A substrate stage 36 is adapted to hold photosensitive substrate 28. Projection optics 38 is received between reticle stage 34 and substrate stage 36, and is configured to receive electromagnetic radiation to project an image of the reticle onto photosensitive substrate 28.

Reticle stage 34 and substrate stage 36 may be mounted or configured for movement in opposing directions relative to arrow 37. Such may be controlled by a suitable controller such that the respective movements are in synchronization so that an illumination field of the electromagnetic radiation scans the entire reticle 26 to reproduce an image thereof onto photosensitive substrate 28. Multiple sequential or adjacent images may be reproduced onto photosensitive substrate 28 with a step and scan-type motion, and in opposite directions relative to photosensitive substrate 28. For example, the depicted positioning of reticle stage 34 and substrate stage 36 may be used to result in an x-axis direction of scan D by movement of substrate stage 36 to the right and reticle stage 34 to the left. At the conclusion of the scan of the entire illumination field along direction D, the substrate may be "stepped" relative to one or both of the x and y axes for exposing another area of the substrate along an x-axis direction of scan which is 180° opposite to that of direction D. Alternately, the substrate might be stepped such that the subsequent scan will be along the same direction D. Regardless of using these or other techniques, step and scanning may be repeated until all desired areas of photosensitive substrate 28 have been scanned using reticle 26.

Figure 4:
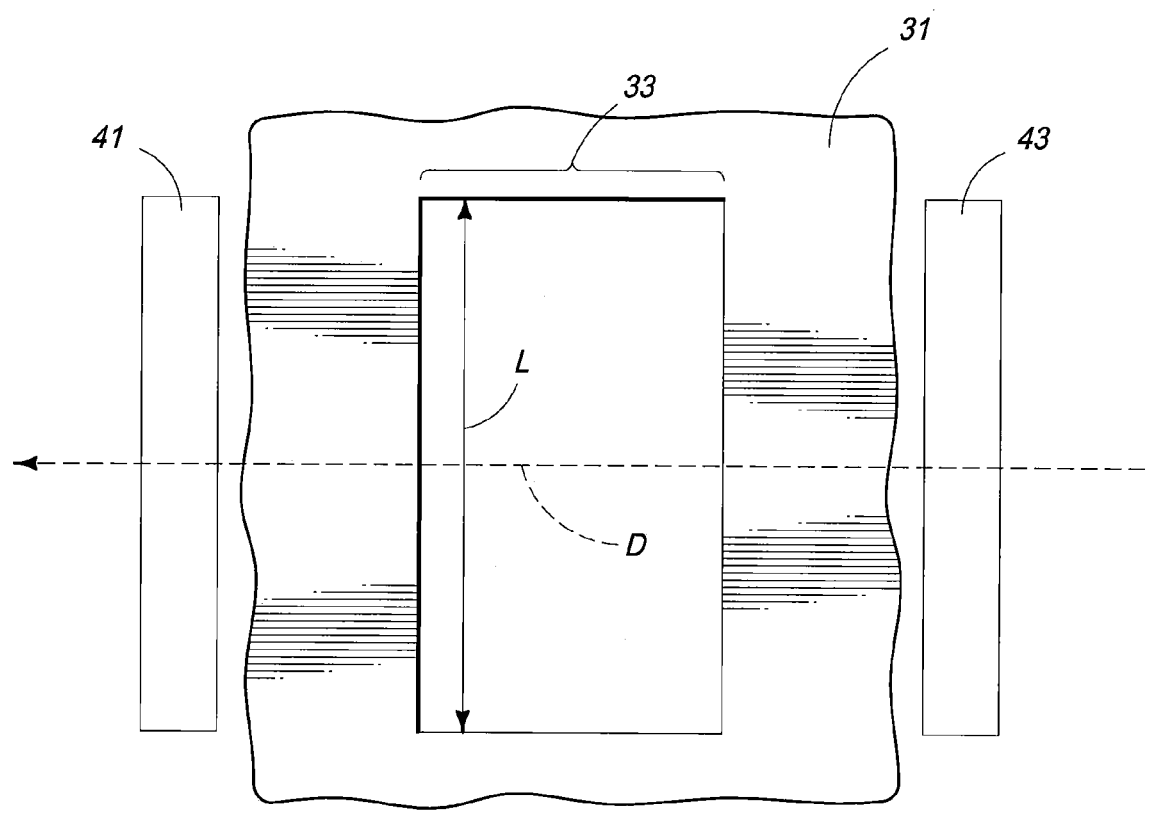
FIG. 4 is a diagrammatic top-down view of a portion of the FIG. 3 schematic taken relative to line 4-4 in FIG. 3.
Figure 5:
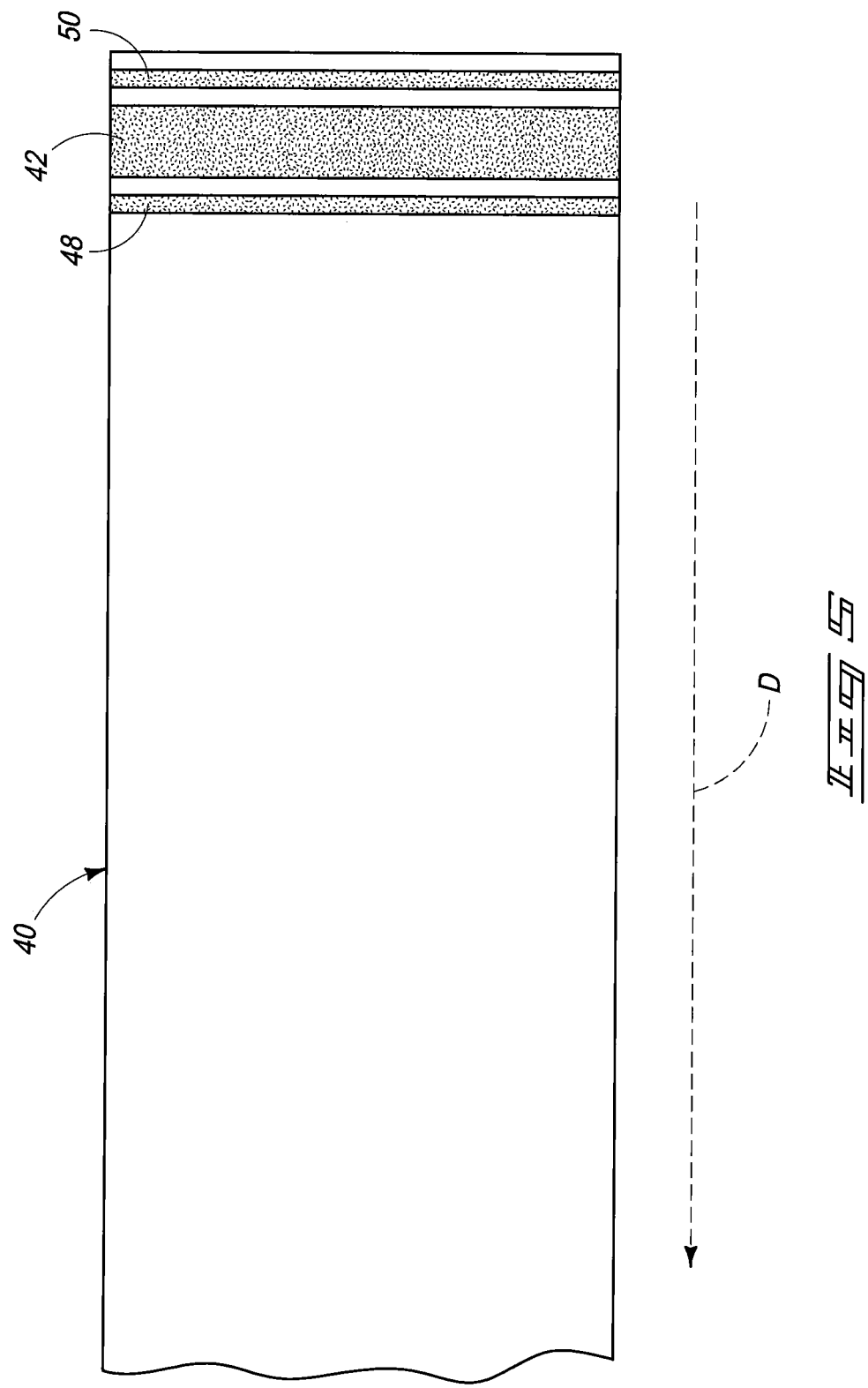
FIG. 5 is a diagrammatic top-down view of part of an exposure field on a substrate definable by operation of the FIG. 3 scanning photolithographic device.

Referring to FIGS. 3-5, scanning device 25 is usable to form a substrate exposure field 40 on photosensitive substrate 28 along direction of scan D. Direction D may be reversed, for example as described above, to produce the same exposure field 40 (FIG. 5). Regardless, exposure field 40 is defined by using a combination of exposure slit 33 and one or both of two electromagnetic radiation emitters 41, 43. Specifically, exposure slit 33 is oriented to extend across direction of scan D, and has a length L there-across (FIG. 4). Such is used to project an image of a portion of reticle 26 entirely across a first portion 42 of exposure field 40 on photosensitive substrate 28 (FIG. 5). First portion 42 would move right-to-left along direction of scan D relative to exposure field 40 during the scanning.

Electromagnetic radiation emitters 41, 43 are laterally adjacent to and laterally spaced from exposure slit 33 along direction of scan D on opposing sides thereof (FIGS. 3 and 4). Such may be projected through an exposure slit laterally adjacent exposure slit 33 along direction of scan D. Regardless, electromagnetic radiation emitters 41, 43 are directed to second and third portions 48, 50, respectively, of exposure field 40 which are different from first portion 42. Second and third portions 48, 50 may or may not extend entirely across exposure field 40, and regardless may be configured to illuminate only selected locations at selected times across portions 48, 50 as opposed to across all of portions 48, 50. Second and third portions 48, 50 may be narrower, wider, or equal to width of first portion 42 along direction of scan D. Second and third portions 48, 50 may or may not be spaced along direction of scan D from first portion 42. If spaced, such may be equal or unequal relative to each other from first portion 42. Regardless, an example spacing of the closest edges of each of portions 48, 50 from that of portion 42 is from 1 Angstrom to 1,000 Angstroms within exposure field 40. Emitters 41, 43 may be correspondingly so placed along direction of scan D relative to exposure slit 33 corresponding to magnification resulting from projection optics 38.

One or both of emitters 41, 43 may be used continuously and/or intermittently during scan of exposure field 40, and/or independently of each other. Further, only a single electromagnetic radiation emitter 41 or 43 might be provided, or more than the two depicted emitters 41, 43 may be provided. Regardless, reticle stage 34 is adapted to hold reticle 26 to receive electromagnetic radiation passing through exposure slit 33 and to receive electromagnetic radiation emitted by any emitter 41, 43. Likewise, projection optics 38 is configured to receive electromagnetic radiation from exposure slit 33 and from one or more emitters 41, 43 to project an image of the reticle onto the photosensitive substrate.

Scanning device 25 includes an electromagnetic radiation splitter 52 downstream of illumination source 30 (FIG. 3). Splitter 52 directs one path 54 of electromagnetic radiation to exposure slit 33 and other paths 56, 58 to electromagnetic radiation emitters 41, 43, respectively. Alternately, multiple and/or different electromagnetic radiation illumination sources may be provided for one or more of the exposure slit and one or more emitters. Scanning device 25 may include attenuators 60, 62 through which electromagnetic radiation passes before being emitted by emitters 41, 43, respectively. Such reduce radiation intensity to enable reduced dose per unit area to be applied within second and third portions 48, 50 along exposure field 40 in comparison to dose provided to first portion 42 from electromagnetic radiation passing through exposure slit 33. Attenuators 60, 62 are diagrammatically shown as being separate from emitters 41, 43, respectively. However, such could be encompassed by a singular device and/or controller.

Emitters 41, 43 may or may not be provided to enable second portion 48 third portion 50 of exposure field 40 to span completely there-across. Regardless, emitters 41, 43 ideally enable selective and timed exposure of selected separate parts of second and third portions 48, 50 as substrate exposure field 40 is scanned along direction D. Accordingly, ideally multiple independently selectable elements are provided by the emitters to enable timely illumination of parts of portions 48, 50 during scanning along direction D.

In some embodiments, an emitter 41 and/or 43 comprises at least one fiber optic element from which electromagnetic radiation is emitted to reticle 26. In one example, such an emitter comprises a plurality of fiber optic elements, for example which are arrayed across the direction of scan. In some embodiments, such plurality is arrayed across the direction of scan to have a length there-across which is at least as great as that of length L of exposure slit 33. For example, FIG. 4 diagrammatically depicts emitters 41 and 43 as spanning across direction of scan D, and having respective lengths which are equal to length L of exposure slit 33.

Figure 6:
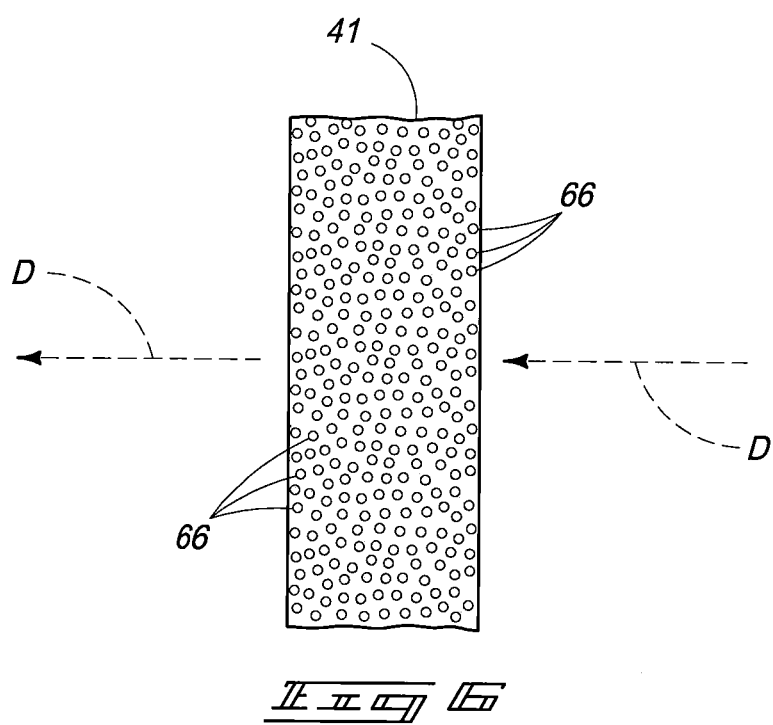
FIG. 6 is an enlarged diagrammatic view of a portion of FIG. 4.

FIG. 6 depicts one example embodiment in the form of a portion of emitter 41 of FIG. 4. Such is depicted as having a plurality of individual fiber optic elements 66 for selectively emitting electromagnetic radiation to pass through reticle 26 of FIG. 3. Ideally, such optic elements would be selectively actuated to illuminate selected areas of portion 48, for example at precise times within exposure field 40 as scanning progresses along scanned direction D. Optic elements 66 may be individually actuated and/or in groups.

Figure 7:
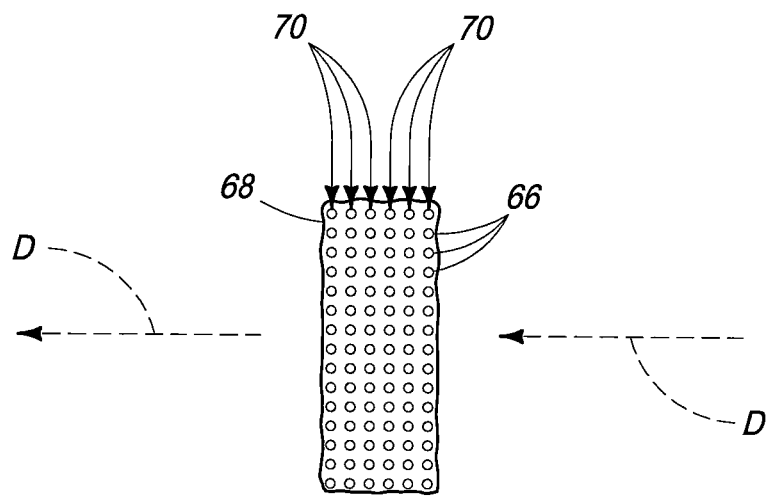
FIG. 7 is a further enlarged diagrammatic view of an alternate embodiment to that of FIG. 6.

In one embodiment, the emitter may comprise at least one fiber optic ribbon cable from which electromagnetic radiation is emitted to the reticle. Fiber optic ribbon cables contain one or more straight rows of individual fiber optic elements. In one embodiment, such a row of fiber optic elements may be oriented perpendicularly across the direction of scan. For example, FIG. 7 depicts one example of a portion of a fiber optic cable 68 having multiple parallel rows 70 of fiber optic elements 66. Such rows 70 are oriented perpendicularly across direction of scan D. Regardless, one or more suitable controllers may be provided to control attenuation and firing of one of more portions of the fiber optic elements or other emitter types.

Device 25 may include a suitable system controller that may be coupled to respective sub-controllers, for example such as a stage controller, attenuator controller, emitter controller, and fiber optic controller. Such may be encompassed by any existing or yet-to-be developed general purposed computing devices and control systems. Further in some embodiments, existing or yet-to-be developed optical elements other than or in addition to fiber optics may be used, for example shutters, adjustable slots/slits, mirrors, and/or prisms.

Embodiments of the invention also encompass scanning photolithography imaging methods. In one embodiment, an imaging method in scanning photolithography for controlling CD variation within an exposure field includes providing at least two paths of electromagnetic radiation. A first of the paths is directed through an exposure slit, then through a reticle, then entirely across a first portion of an exposure field on a photosensitive substrate. If using scanning photolithographic device 25, electromagnetic radiation path 54 is such an example first path, with region 42 being an example of a first portion of an exposure field 40 on a photosensitive substrate.

A second of the paths is directed through at least one optical fiber, then through the reticle, then to a second portion of the exposure field which is different from the first portion. If using scanning photolithographic device 25 in practice of such a method, either of electromagnetic radiation paths 56 or 58 is an example such second path, with either of portions 48 or 50 of exposure field 40 being an example of the stated second portion. Such directed first and second paths are spaced from each other along a direction of scan D. In one embodiment, the electromagnetic radiation of the second path is attenuated per area of exposure on the photosensitive substrate relative or in comparison to the electromagnetic radiation of the first path. By way of example only with respect to device 25, attenuator 60 or 62 may provide such a function.

Figure 1:
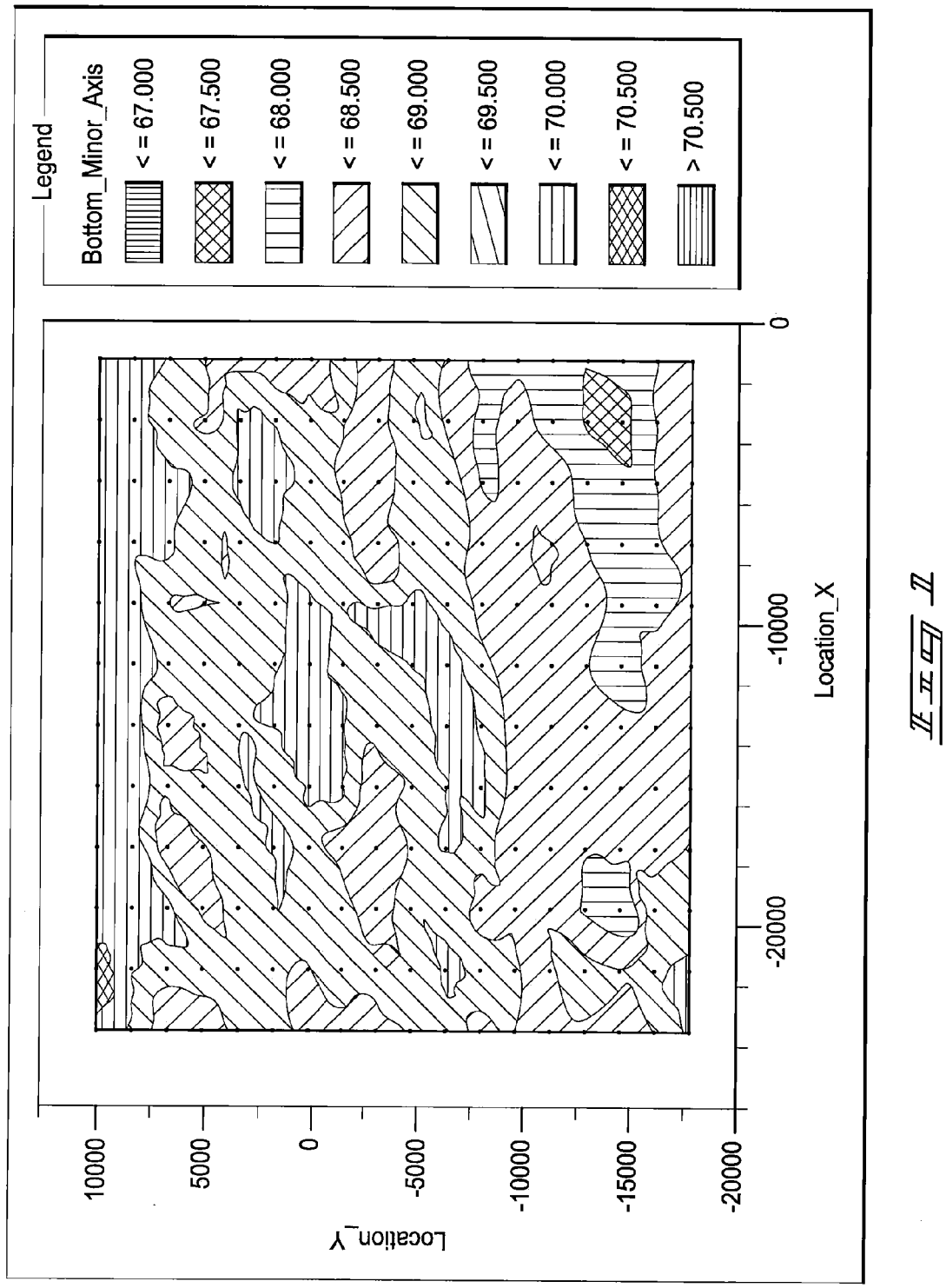
FIG. 1 is a graphical representation of CD variation on a portion of a substrate.
Figure 2:
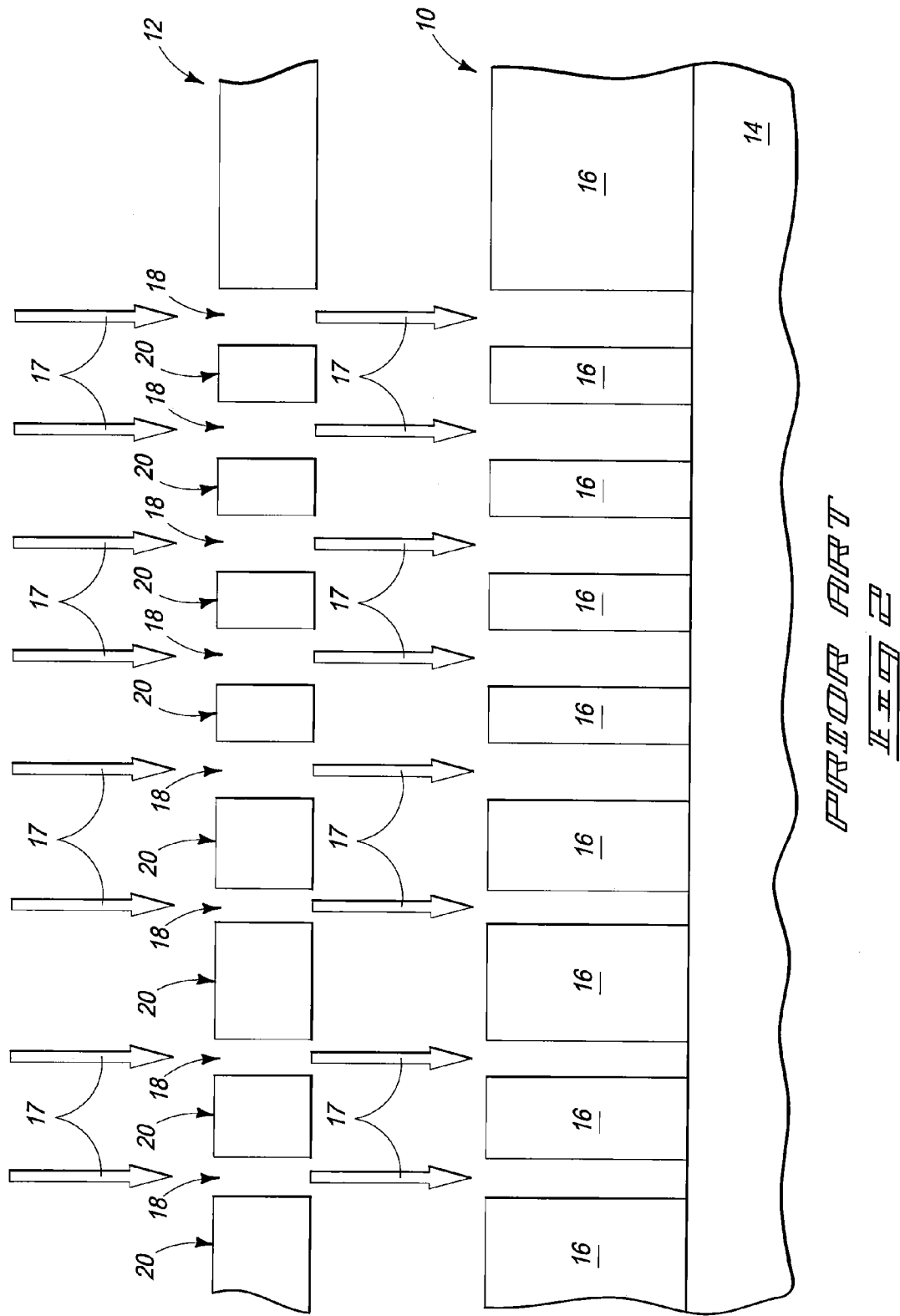
FIG. 2 is a diagrammatic sectional view of photolithographic processing according to a prior art technique.

The exposure field is scanned with the electromagnetic radiation of the first path being received entirely across the first portion of the exposure field while scanning the exposure field along the direction of scan. Commensurate therewith, electromagnetic radiation passing through the at least one optical fiber is applied to selected locations within the exposure field as the second portion and first portion move across the exposure field while scanning along the direction of scan. For example and by way of example only, consider the CD variation plot of FIG. 1. Such might be obtained experimentally or by modeling where at least some of areas of such CD variation can be overcome by increased exposure to electromagnetic radiation. The selected areas of the substrate requiring such may be selectively exposed to additional radiation through the stated second path as scanning occurs along the exposure field. By way of example only, FIG. 8 shows processing which may occur to overcome the CD variation problem identified in FIG. 2. Added dose exposure may occur through the depicted portions of the reticle by electromagnetic radiation emitted by an emitter through the affected area to reduce CD variation in photoresist layer 16 over substrate 14.

The selected added exposure dose, depending on application, may be provided entirely along the exposure field or only selected locations thereof. Further, the added exposure dose may lead or trail the dose applied through the main exposure slit along the direction of scan. Further, the added exposure dose may be applied both before and after the exposure occurring through the main exposure slit during the scanning of the exposure field.

In one embodiment, application of the electromagnetic radiation through the second path may be through multiple optical fibers of at least one fiber optic ribbon cable. In one embodiment, such one or more fiber optic ribbon cables may be oriented such that one or more rows of its fiber optic elements are oriented perpendicularly across a direction of scan.

In one embodiment, an imaging method in scanning photolithography to control CD variation within an exposure field includes splitting a source of electromagnetic radiation into at least two paths. A first of the paths is directed through an exposure slit, then through a reticle, then entirely across a first portion of an exposure field on a photosensitive substrate. A second of the paths is directed through an attenuator, then through the reticle, then to a second portion of the exposure field which is different from the first portion. The directed first and second paths are spaced from each other along a direction of scan. In one embodiment, the second path is split into multiple optical fibers before passing through the reticle.

The attenuated electromagnetic radiation of the second path is applied to selected locations within the exposure field while scanning all of the exposure field with the electromagnetic radiation of the first path along the direction of scan. In one embodiment, the second path is directed through fiber optics after the attenuator and before passing through the reticle. The descriptions with respect to the above-described embodiments are examples.

In one embodiment, the source of electromagnetic radiation is split into a third path which is spaced from the first and second paths along the direction of scan, and with the first path being between the second and third paths. For example and by way of example only, scanning photolithographic device 25 may be used in such a method. In one embodiment, the third path is directed through an attenuator, then through the reticle, then to a third portion of the exposure field which is different from the first and second portions. The attenuated electromagnetic radiation of both of the second and third paths may be applied to the selected locations within the exposure field while scanning all of the exposure field with the electromagnetic radiation of the first path along the direction of scan. Alternately for example, use of the second and third paths can alternate in one or both of leading or trailing relative to the direction of scan while scanning the exposure field.

Any other methodical attributes as described above may be utilized.

In one embodiment, an imaging method in scanning photolithography includes applying different quantity first and second exposure doses of electromagnetic radiation through a reticle to a photosensitive substrate while scanning across a substrate exposure field along a direction of scan. In such embodiment, the first dose spans entirely across the width of the exposure field during the scan and occurs all along the exposure field. The second dose covers less than the entire width of the exposure field during the scan. The second dose is applied at a location which is spaced along the direction of scan from where the first dose is being applied while the first dose is being so applied. Such may be conducted regardless of whether the first dose is greater than the second dose, regardless of whether the second dose is applied all along the exposure field, and regardless of whether application of the second dose reduces CD variation. However, any one or combination of the above methodical techniques may be used in practice of this just-stated embodiment.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. An imaging method in scanning photolithography to control CD variation within an exposure field, comprising:

splitting a source of electromagnetic radiation into at least two paths; a first of the paths being directed through an exposure slit, then through a reticle, then onto a first longitudinal portion of length of a total exposure field on a photosensitive substrate, the total exposure field on the photosensitive substrate having a maximum total width orthogonal to a direction of scan that is along the length of the total exposure field, the first longitudinal portion extending completely and continuously across the maximum total width of the total exposure field; a second of the paths being directed through an attenuator, then through the reticle, then to a second longitudinal portion of the total exposure field which is different from the first longitudinal portion; the directed first and second paths being spaced from each other along the direction of scan; and applying the attenuated electromagnetic radiation of the second path to selected locations within the total exposure field while scanning all of the total exposure field with the electromagnetic radiation of the first path along the direction of scan.

2. The method of claim 1 wherein the second path is directed through fiber optics after the attenuator and before passing through the reticle.

3. The method of claim 1 comprising splitting the second path into multiple optical fibers before passing through the reticle.

4. The method of claim 1 wherein the source of electromagnetic radiation is split into a third path, the third path being spaced from the first and second paths along the direction of scan, the first path being between the second and third paths along the direction of scan.

5. The method of claim 4 comprising:

directing the third path through an attenuator, then through the reticle, then to a third longitudinal portion of the total exposure field which is different from the first and second longitudinal portions; and applying the attenuated electromagnetic radiation of both of the second and third paths to the selected locations within the total exposure field while scanning all of the total exposure field with the electromagnetic radiation of the first path along the direction of scan.

6. The method of claim 5 wherein the third longitudinal portion extends completely and continuously across the maximum total width of the total exposure field.

7. The method of claim 5 wherein the third longitudinal portion does not extend completely and continuously across the maximum total width of the total exposure field.

8. The method of claim 1 wherein longitudinal confines of all of the second longitudinal portion along the direction of scan are entirely within longitudinal confines of the first longitudinal portion along the direction of scan within the total exposure field.

9. The method of claim 1 comprising only a single projection optics between the reticle and the photosensitive substrate, and wherein the first and second paths pass through the same, single, common projection optics between the reticle and the photosensitive substrate.

10. The method of claim 1 wherein the second path is directed though fiber optics, the source being split before passing through fiber optics.

11. The method of claim 1 wherein the second longitudinal portion extends completely and continuously across the maximum total width of the total exposure field.

12. The method of claim 1 wherein the second longitudinal portion does not extend completely and continuously across the maximum total width of the total exposure field.

13. An imaging method in scanning photolithography to control CD variation within an exposure field, comprising:

providing at least two paths of electromagnetic radiation, a first of the paths being directed through an exposure slit, then through a reticle, then onto a first longitudinal portion of length of a total exposure field on a photosensitive substrate, the total exposure field on the photosensitive substrate having a maximum total width orthogonal to a direction of scan that is along the length of the total exposure field, the first longitudinal portion extending completely and continuously across the maximum total width of the total exposure field; a second of the paths being directed through at least one optical fiber, then through the reticle, then to a second longitudinal portion of the total exposure field which is different from the first longitudinal portion; the directed first and second paths being spaced from each other along the direction of scan; and applying the electromagnetic radiation passing through the at least one optical fiber to selected locations within the total exposure field while scanning of the total exposure field with the electromagnetic radiation of the first path along the direction of scan.

14. The method of claim 13 wherein the electromagnetic radiation of the second path is attenuated per area of exposure on the photosensitive substrate relative to the electromagnetic radiation of the first path.

15. The method of claim 13 wherein the applying is through multiple optical fibers of at least one fiber optic ribbon cable.

16. The method of claim 15 wherein the at least one fiber optic ribbon cable is oriented such that a row of its fiber optic elements is oriented perpendicularly across the direction of scan.

17. The method of claim 13 wherein longitudinal confines of all of the second longitudinal portion along the direction of scan are entirely within longitudinal confines of the first longitudinal portion along the direction of scan within the total exposure field.

18. The method of claim 13 comprising only a single projection optics between the reticle and the photosensitive substrate, and wherein the at least two paths pass through the same, single, common projection optics between the reticle and the photosensitive substrate.

* * * * *